(12) United States Patent
Kimura

(10) Patent No.: US 9,984,966 B2
(45) Date of Patent: May 29, 2018

(54) SEMICONDUCTOR DEVICE HAVING FUSE ELEMENTS

(71) Applicant: SII Semiconductor Corporation, Chiba-shi, Chiba (JP)

(72) Inventor: Yoshitaka Kimura, Chiba (JP)

(73) Assignee: ABLIC INC., Chiba (JP)

( * ) Notice: Subject to any disclaimer, the term of this patent is extended or adjusted under 35 U.S.C. 154(b) by 0 days. days.

(21) Appl. No.: 15/420,744

(22) Filed: Jan. 31, 2017

(65) Prior Publication Data
US 2017/0221824 A1 Aug. 3, 2017

(30) Foreign Application Priority Data

Feb. 1, 2016 (JP) .................................. 2016-017350

(51) Int. Cl.
| | | |
|---|---|---|
| *H01L 23/52* | (2006.01) | |
| *H01L 23/62* | (2006.01) | |
| *H01L 23/525* | (2006.01) | |
| *H01L 23/532* | (2006.01) | |

(52) U.S. Cl.
CPC .... *H01L 23/5258* (2013.01); *H01L 23/53209* (2013.01); *H01L 23/53257* (2013.01); *H01L 23/53271* (2013.01); *H01L 23/53295* (2013.01); *H01L 23/5256* (2013.01); *H01L 23/62* (2013.01)

(58) Field of Classification Search
CPC ........... H01L 23/5258; H01L 23/53209; H01L 23/53257; H01L 23/53271; H01L 23/53295; H01L 23/5256; H01L 23/62
See application file for complete search history.

(56) References Cited

U.S. PATENT DOCUMENTS

| | | | | |
|---|---|---|---|---|
| 4,413,272 A | * | 11/1983 | Mochizuki | G11C 17/16 257/529 |
| 6,078,091 A | * | 6/2000 | MacPherson | H01L 21/76892 257/209 |
| 6,235,557 B1 | * | 5/2001 | Manley | H01L 23/5258 257/E23.15 |
| 6,440,834 B2 | * | 8/2002 | Daubenspeck | H01L 23/5258 257/529 |
| 6,869,750 B2 | * | 3/2005 | Zhang | H01L 21/486 428/106 |
| 8,455,985 B2 | * | 6/2013 | Han | H01L 21/02126 257/638 |
| 2005/0189612 A1 | * | 9/2005 | Hung | H01L 21/76807 257/529 |

(Continued)

FOREIGN PATENT DOCUMENTS

JP 2000-040388 A 2/2000

*Primary Examiner* — Ida M Soward
(74) *Attorney, Agent, or Firm* — Brinks Gilson & Lione

(57) ABSTRACT

Provided is a semiconductor device preventing readhesion of conductive body which forms fuse elements and breakage of the fuse elements. The semiconductor device includes a first insulating film formed on a semiconductor substrate, a plurality of fuse elements formed on the first insulating film adjacent to one another, a protective insulating film covering at least side surfaces of the fuse elements, and a second insulating film formed of one of a BPSG film and a PSG film to cover the fuse elements and the protective insulating film. The protective insulating film is higher in mechanical strength than the second insulating film.

6 Claims, 9 Drawing Sheets

(56) References Cited

U.S. PATENT DOCUMENTS

| | | | |
|---|---|---|---|
| 2006/0214260 A1* | 9/2006 | Cho .................... | H01L 23/5258 257/529 |
| 2007/0122945 A1* | 5/2007 | Kim .................... | H01L 23/5258 438/132 |
| 2012/0133019 A1* | 5/2012 | Kim .................... | H01L 23/5258 257/529 |
| 2015/0332842 A1* | 11/2015 | Shimoichi ............ | H01F 27/292 336/200 |
| 2016/0050760 A1* | 2/2016 | Tamagawa ............. | H01C 1/012 361/752 |

* cited by examiner

SEMICONDUCTOR DEVICE HAVING FUSE ELEMENTS

RELATED APPLICATIONS

This application claims priority under 35 U.S.C. § 119 to Japanese Patent Application No. 2016-017350 filed on Feb. 1, 2016, the entire content of which is hereby incorporated by reference.

BACKGROUND OF THE INVENTION

1. Field of the Invention

The present invention relates to a semiconductor device, more particularly, to a semiconductor device having a fuse element which blows by laser irradiation.

2. Description of the Related Art

Fuse elements are generally and widely used in adjustment of a resistance value of a semiconductor device or fixing a setting of a redundant circuit. Cutting of a fuse element gives a change from a conductive state to a non-conductive state occurs, and desired information is stored in a trimming circuit. Cutting of a fuse element is done by a method of making a fuse element blow by laser irradiation, a method of making a fuse element melt and separate by a flow of a large current, or the like.

A fuse element which blows by laser irradiation is cut by an irradiation of laser light through an insulating film of silicon oxide or the like which covers the fuse element formed of a conductive body such as polycrystalline silicon (see, for example, Japanese Patent Application Laid-open No. 2000-40388).

In recent years, along with downsizing of semiconductor devices, downsizing of fuse elements is also demanded. Space between adjacent fuse elements, in particular, needs to be narrowed when a plurality of fuse elements is arranged in parallel.

FIG. 7A and FIG. 7B are diagrams for illustrating the configuration of a downsized semiconductor device 400 of the related art. FIG. 7A is a plan view of an area of the semiconductor device 400 that has a plurality of fuse elements formed therein. FIG. 7B is a sectional view taken along the line B-B of FIG. 7A.

As illustrated in FIG. 7A and FIG. 7B, the semiconductor device 400 of the related art has, on an insulating film 42 formed on a semiconductor substrate 41, a plurality of fuse elements 43 (43a, 43b, and 43c) arranged close to one another and formed of a conductive body such as a polysilicon film. An insulating film 45, which covers the plurality of fuse elements 43, is further provided, and a fuse opening 46 for laser irradiation is formed in the insulating film 45.

FIG. 8A, FIG. 8B, and FIG. 8C are diagrams for illustrating an example of problems that occur during cutting of the fuse elements 43 in the semiconductor device 400 of FIG. 7A and FIG. 7B. FIG. 8A is a plan view corresponding to FIG. 7A. FIG. 8B is a sectional view taken along the line B-B of FIG. 8A. FIG. 8C is a sectional view taken along the line C-C of FIG. 8A.

Of the three fuse elements 43 illustrated in FIG. 8A, FIG. 8B, and FIG. 8C, the fuse element 43a on the left side and the fuse element 43b in the middle are cut.

As illustrated in FIG. 8A, FIG. 8B, and FIG. 8C, when the fuse elements 43a and 43b arranged close to each other are each irradiated by laser light, portions of the conductive body of the fuse elements 43a and 43b, which are irradiated by laser light, are melted and evaporated, thereby raising the vapor pressure and exploding along with portions of the insulating film 45 covering the irradiated portions. The fuse elements 43a and 43b consequently fall into a non-conductive state.

However, the narrow space between the adjacent fuse elements 43 causes a fuse blow mark 47, which is formed as a result of the laser irradiation, to be continuous with its adjacent fuse blow mark 47.

The melted and evaporated conductive body may not blow off far enough and may readhere to inner side surfaces of the fuse blow marks 47 to form a readhesion layer 48 accidentally as illustrated in FIG. 8A and FIG. 8C. Specifically, the readhesion of the evaporated conductive body causes an electrical short circuit between the adjacent fuse elements 43 that have been cut.

This problem occurs for the following reason.

The semiconductor device 400 uses as the insulating film 45 a BPSG film or a PSB film, which is highly moisture-resistant, in order to prevent moisture seeping from the outside from corroding the fuse elements 43, wiring (not shown), and other components. However, while having excellent moisture resistance, a BPSG film and a PSG film are low in mechanical strength.

When the insulating film 45 is low in mechanical strength, the conductive body irradiated with laser light explodes at a point where the vapor pressure of the conductive body is not high enough. The conductive body consequently is not blown far, and chances are high that the melted and evaporated conductive body readheres to the inside of the fuse blow mark 47. With the space between the adjacent fuse elements 43 narrowed for size reduction, which causes the adjacent fuse flow marks 47 to be continuous with each other as described above, the readhesion layer 48 is formed in a pattern that connects the cut fuse elements 43a and 43b as illustrated in FIG. 8A. The fuse elements 43a and 43b are short-circuited as a result.

FIG. 9A and FIG. 9B are diagrams for illustrating another example of the problems that occur during cutting of the fuse elements 43. FIG. 9A is a plan view corresponding to FIG. 7A. FIG. 9B is a sectional view taken along the line B-B of FIG. 9A.

Of the three fuse elements 43 illustrated in FIG. 9A and FIG. 9B, the fuse element 43b in the middle is cut.

When the fuse element 43b is blown by being irradiated with laser light, its adjacent fuse element 43 (the fuse element 43c in this example) may partially be exposed inside the fuse blow mark 47 as illustrated in FIG. 9A and FIG. 9B.

Specifically, the low mechanical strength of the insulating film 45 described above permits the fuse blow mark 47 to spread to an area over the fuse element 43c, which is adjacent to the fuse element 43b, and an exposed portion EXP is formed in the fuse element 43c. The exposure of the fuse element 43c leads to such problems as the corrosion of the fuse element 43c from moisture and disconnection of the fuse element 43c due to oxidation started at the exposed portion EXP.

The frequency of problems illustrated in FIG. 8A to FIG. 8C and FIG. 9A and FIG. 9B increases particularly when the space between adjacent fuse elements is 5 μm or less.

SUMMARY OF THE INVENTION

The present invention has been made to solve the problems described above, and an object of the present invention is to provide a semiconductor device capable of preventing the readhesion of a conductive body from which fuse elements are made, disconnection of the fuse elements, and other troubles when the fuse elements are cut by laser irradiation, despite the narrowness of a space between adjacent fuse elements, while maintaining the moisture resistance of the fuse elements.

According to one embodiment of the present invention, there is provided a semiconductor device, including: a first insulating film formed on a semiconductor substrate; a plurality of fuse elements formed adjacent to one another on the first insulating film; a protective insulating film for covering at least side surfaces of the plurality of fuse elements; and a second insulating film formed of one of a BPSG film and a PSG film to cover the plurality of fuse elements and the protective insulating film, the protective insulating film being higher in mechanical strength than the second insulating film.

According to the present invention, where the protective insulating film higher in mechanical strength than the second insulating film covers at least the side surfaces of the fuse elements, when one of the fuse elements is irradiated with laser light, the fuse element explodes at the time when a portion of a conductive body of the fuse element that is irradiated with laser light reaches a high vapor pressure level. The force of the explosion is accordingly greater than in the semiconductor device 400 of the related art, thereby blowing the melted and evaporated conductive body far. The resultant effect is that the conductive body has less chance of readhering to the inside of a blow mark formed by the explosion.

In addition, the presence of the protective insulating film covering the side surfaces of the fuse elements keeps the force of the explosion from spreading in the horizontal direction, thereby preventing the fuse blow mark of the fuse element that is irradiated with laser light from extending to an area above its adjacent fuse element. The exposure of the adjacent fuse element can thus be avoided.

BRIEF DESCRIPTION OF THE DRAWINGS

FIG. 1A is a plan view of an area of the semiconductor device 100 that has a plurality of fuse elements formed therein. FIG. 1B is a sectional view taken along the line B-B of FIG. 1A.

FIG. 2A is a plan view corresponding to FIG. 1A and FIG. 2B is a sectional view taken along the line B-B of FIG. 2A.

FIG. 3A is a plan view of an area of the semiconductor device 200 that has a plurality of fuse elements formed therein. FIG. 3B is a sectional view taken along the line B-B of FIG. 3A.

FIG. 4A is a plan view corresponding to FIG. 3A and FIG. 4B is a sectional view taken along the line B-B of FIG. 4A.

FIG. 5A is a plan view of an area of the semiconductor device 300 that has a plurality of fuse elements formed therein. FIG. 5B is a sectional view taken along the line B-B of FIG. 5A.

FIG. 6A is a plan view corresponding to FIG. 5A and FIG. 6B is a sectional view taken along the line B-B of FIG. 6A.

FIG. 7A is a plan view of an area of the semiconductor device 400 that has a plurality of fuse elements formed therein. FIG. 7B is a sectional view taken along the line B-B of FIG. 7A.

FIG. 8A is a plan view corresponding to FIG. 7A, FIG. 8C is a sectional view taken along the line C-C of FIG. 8A.

FIG. 9A is a plan view corresponding to FIG. 7A and FIG. 9B is a sectional view taken along the line B-B of FIG. 9A.

DETAILED DESCRIPTION OF THE PREFERRED EMBODIMENTS

Figure 1A:
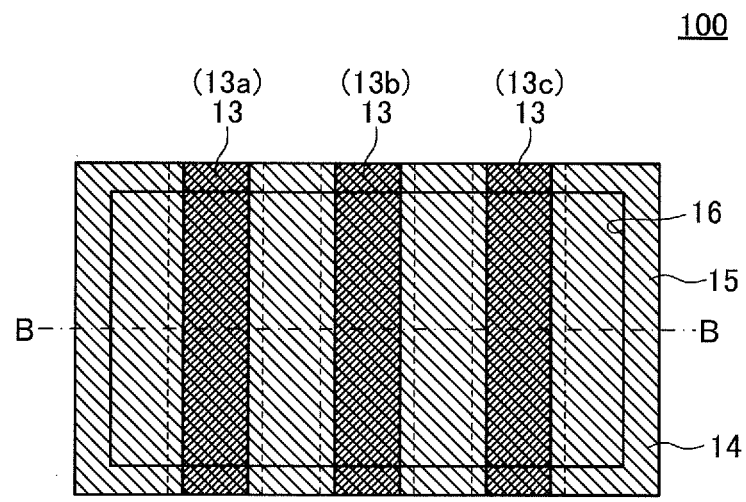
FIG. 1A and FIG. 1B are diagrams for illustrating the structure of a semiconductor device 100 according to a first embodiment of the present invention.

Description is now given of embodiments of the present invention referring to the drawings.

First Embodiment

Figure 1B:
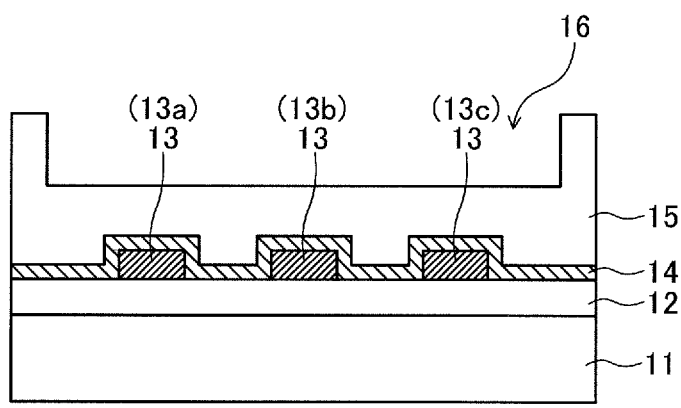

FIG. 1A and FIG. 1B are diagrams for illustrating the structure of a semiconductor device 100 according to a first embodiment of the present invention. FIG. 1A is a plan view of an area of the semiconductor device 100 that has a plurality of fuse elements formed therein. FIG. 1B is a sectional view taken along the line B-B of FIG. 1A.

As illustrated in FIG. 1A and FIG. 1B, the semiconductor device 100 of this embodiment includes an insulating film 12 formed on a semiconductor substrate 11, and a plurality of fuse elements 13 (13a, 13b, and 13c) formed on the insulating film 12 from a conductive body, e.g., a polysilicon film and arranged close to one another. A protective insulating film 14 is further formed to cover side surfaces and top surfaces of the plurality of fuse elements 13, and a top surface of the insulating film 12. An insulating film 15 is formed on the protective insulating film 14. A fuse opening 16 for laser irradiation is formed in the insulating film 15.

The insulating film 15 is formed of a BPSG film or a PSG film, which is a film low in water permeability, that is, high in moisture resistance, in order to prevent moisture seeping from the outside from corroding (through oxidation or the like) the fuse elements 13, as well as wiring and other components formed in areas that are not illustrated in the drawings.

The protective insulating film 14 can be formed of an insulating film that is higher in mechanical strength than the insulating film 15, for example, a silicon nitride film or a silicon oxynitride film. A silicon nitride film and a silicon oxynitride film both can readily be introduced into an ordinal semiconductor manufacturing process.

Of many indices of mechanical strength, the flexural strength, for example, of quartz ($SiO_2$) including a BPSG film and a PSG film is approximately 150 Mpa, whereas the flexural strength of silicon nitride including a silicon nitride film ranges from 600 Mpa to 1,000 Mpa, which is higher than that of the $SiO_2$.

In the thus configured semiconductor device 100, when the fuse elements 13a and 13b arranged close to each other out of the three fuse elements 13 illustrated in FIG. 1A and FIG. 1B are each irradiated with laser light, portions of the conductive body of the fuse elements 13a and 13b that are irradiated with laser light are melted and evaporated, thereby raising the vapor pressure. Explosion does not happen immediately after the conductive body is melted and evaporated, because side surfaces and top surfaces of the fuse elements 13 are covered with the protective film 14, which is higher in mechanical strength than the insulating film 15. Specifically, the fuse elements 13a and 13b along with the protective insulating film 14 and the insulating film 15 above the protective insulating film 14 explode only after the vapor pressure of the portions irradiated with laser light reaches a high enough level. The fuse elements 13a and 13b consequently fall into a non-conductive state.

Figure 2A:
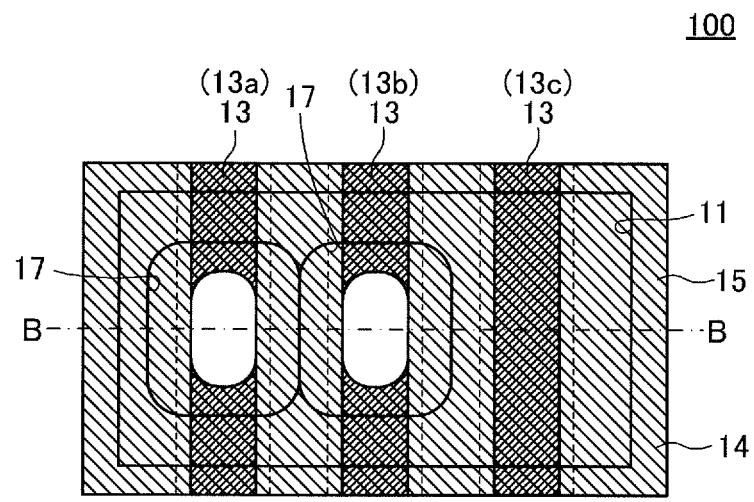
FIG. 2A and FIG. 2B are diagrams for illustrating a state after some of the fuse elements are blown in the semiconductor device 100 of FIG. 1A and FIG. 1B.
Figure 2B:
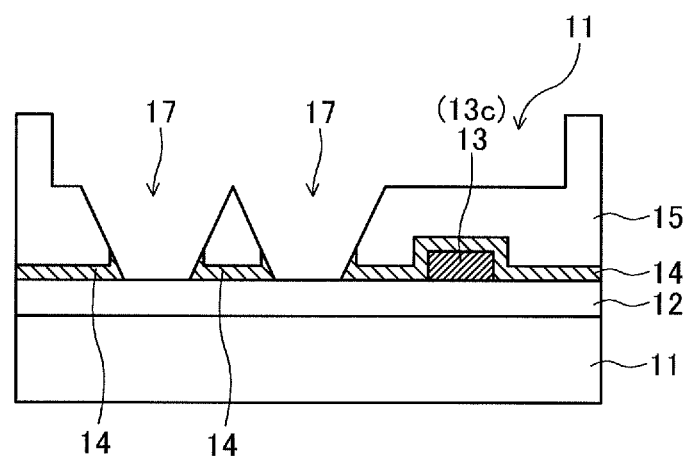

The state in which the fuse elements 13a and 13b are cut in this manner is illustrated in FIG. 2A and FIG. 2B. FIG. 2A is a plan view corresponding to FIG. 1A. FIG. 2B is a sectional view taken along the line B-B of FIG. 2A.

Figure 8A:
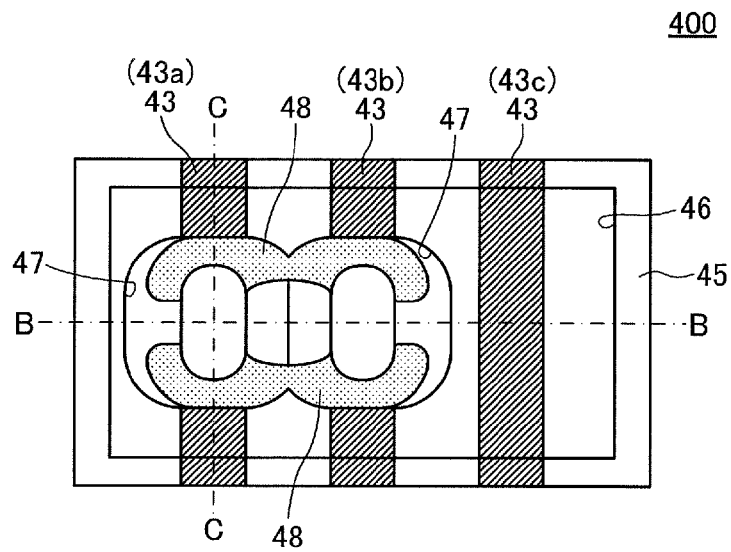
FIG. 8A and FIG. 8C are diagrams for illustrating a problem that occurs after some of the fuse elements of the semiconductor device 400 of the related art are blown.
Figure 8B:
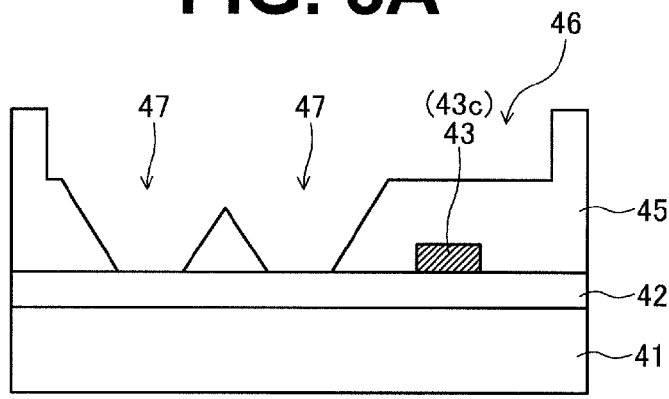
FIG. 8B is a sectional view taken along the line B-B of FIG. 8A.
Figure 8C:
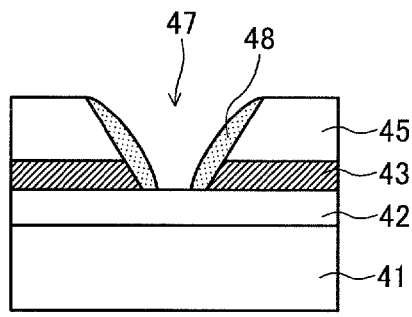
Figure 9A:
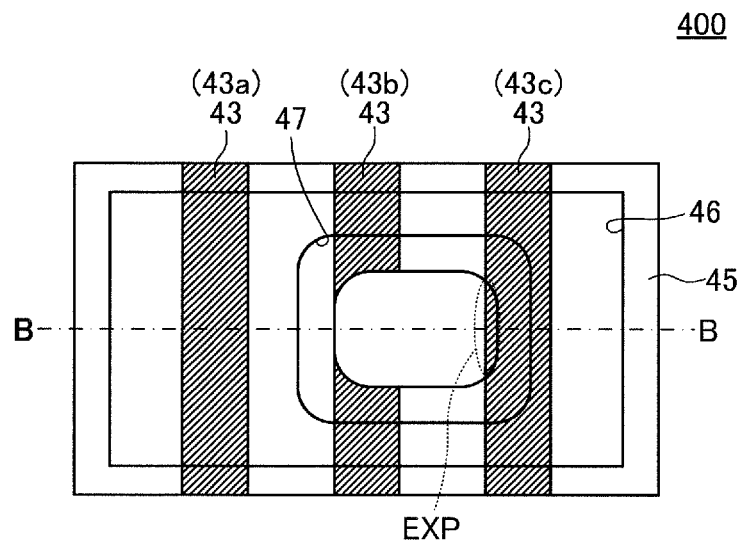
FIG. 9A and FIG. 9B are diagrams for illustrating another problem that occurs after some of the fuse elements of the semiconductor device 400 of the related art are blown.
Figure 9B:
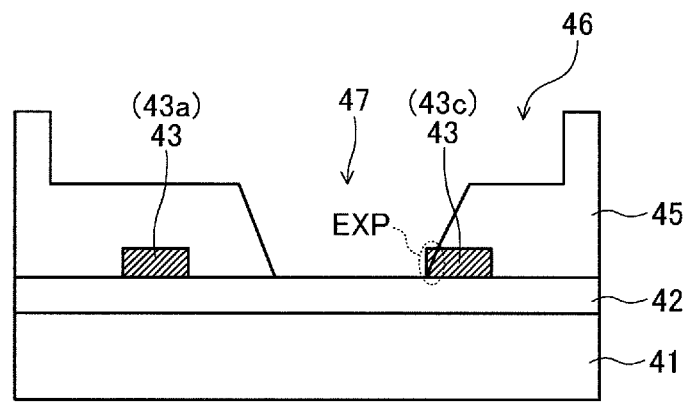

As illustrated in FIG. 2A and FIG. 2B, no readhesion layer is formed inside fuse blow marks 17, which are formed around the respective cut portions of the fuse elements 13a and 13b. A short circuit between the cut fuse elements 13a and 13b is therefore prevented unlike the semiconductor device 400 of the related art which is illustrated in FIG. 8A to FIG. 8C. This is because, as described above, when the side surfaces and top surfaces of the fuse elements 13 are covered with the protective insulating film 14, it is ensured that explosion occurs after the portions of the conductive body that are irradiated with laser light reach a high enough vapor pressure level, which helps to scatter the melted and evaporated conductive body far.

In addition, with the side surfaces of the fuse elements 13 being supported by the protective insulating film 14, which has high mechanical strength, the force of the explosion is kept from spreading in the horizontal direction, and the blow mark of a fuse element that is irradiated with laser light is prevented from extending to an area above its adjacent fuse element. The exposure of the adjacent fuse element (for example, the fuse element 13c) and resultant damage can thus be avoided.

A desirable thickness of the protective insulating film 14 on the top surfaces of the fuse elements 13 is 100 nm or less in this embodiment because too thick a protective insulating film 14 makes it difficult to blow the fuse elements 13 under ordinal laser irradiation conditions. A preferred lower limit is 10 nm so that the protective insulating film 14 can be formed in a stable fashion.

The protective insulating film 14 is formed after the fuse elements 13 are formed on the insulating film 12, by plasma CVD, for example, as a film unitary with the top surfaces and side surfaces of the fuse elements 13, and with the top surface of the insulating film 12. The thickness of the protective insulating film 14 on the side surfaces of the fuse elements in this embodiment is therefore limited to one equivalent to the thickness of the protective insulating film 14 on the top surfaces of the fuse elements 13.

A configuration in which the side surfaces of the fuse elements 13 are supported more solidly is described below as a second embodiment of the present invention.

Second Embodiment

Figure 3A:
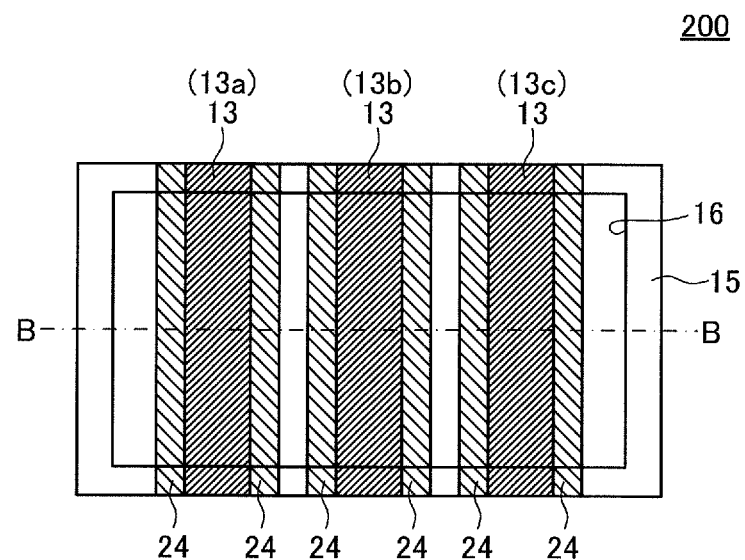
FIG. 3A and FIG. 3B are diagrams for illustrating the structure of a semiconductor device 200 according to a second embodiment of the present invention.
Figure 3B:
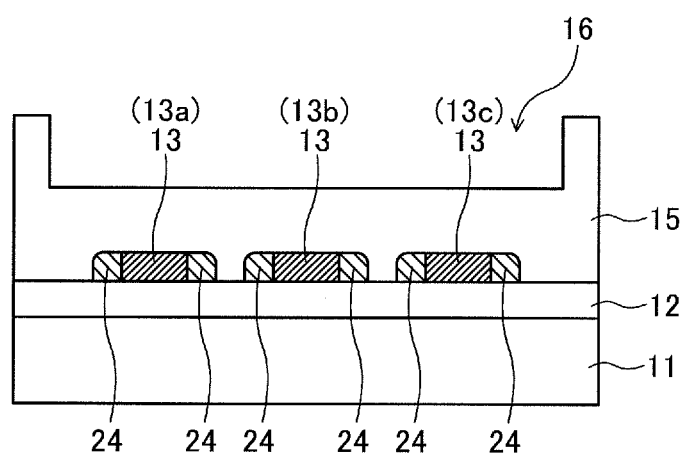

FIG. 3A and FIG. 3B are diagrams for illustrating the structure of a semiconductor device 200 according to the second embodiment. FIG. 3A is a plan view of an area of the semiconductor device 200 that has a plurality of fuse elements formed therein. FIG. 3B is a sectional view taken along the line B-B of FIG. 3A.

In the semiconductor device 200 of this embodiment, a protective insulating film 24 is formed on the left and right side surfaces of each fuse element 13 in place of the protective insulating film 14 in the semiconductor device 100 of the first embodiment which is illustrated in FIG. 1A and FIG. 1B. Similar to the protective insulating film 14, the protective insulating film 24 can be formed of an insulating film that is higher in mechanical strength than the insulating film 15, for example, a silicon nitride film or a silicon oxynitride film.

The rest of the configuration of the semiconductor device 200 is the same as the semiconductor device 100 of FIG. 1A and FIG. 1B. Components of the semiconductor device 200 that are the same as those of the semiconductor device 100 are therefore denoted by the same reference symbols, and duplicate descriptions are omitted as appropriate.

The protective insulating film 24 is not formed on the top surfaces of the fuse elements 13 and the top surface of the insulating film 12 unlike the protective insulating film 14 of the first embodiment. The protective insulating film 24 is formed to have a thickness greater than the thickness of the protective insulating film 14 in the semiconductor device 100. The protective insulating film 24 thus supports the side surfaces of the fuse elements 13 more solidly than the protective insulating film 14 does in the semiconductor device 100.

Figure 4A:
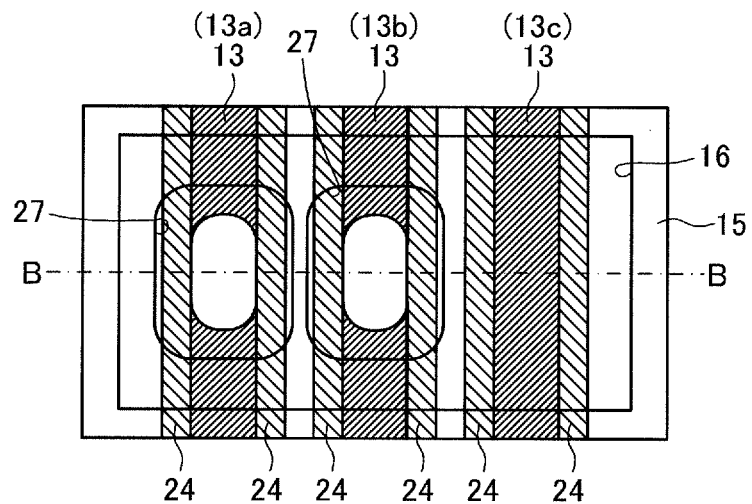
FIG. 4A and FIG. 4B are diagrams for illustrating a state after some of the fuse elements are blown in the semiconductor device 200 of FIG. 3A and FIG. 3B.
Figure 4B:
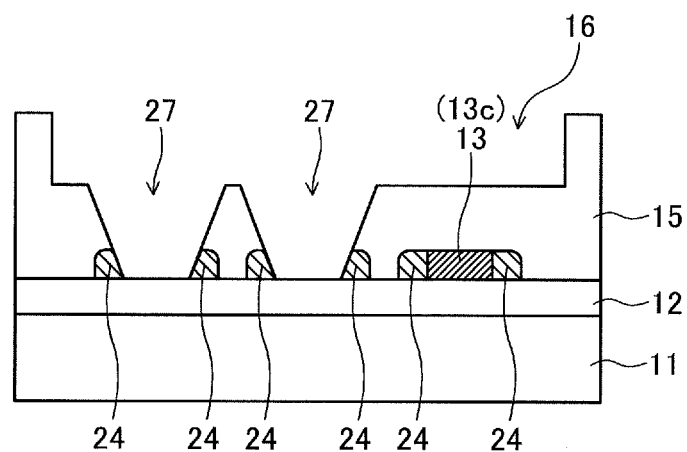

A state where the fuse elements 13a and 13b in the semiconductor device 200 are cut by laser irradiation is illustrated in FIG. 4A and FIG. 4B. FIG. 4A is a plan view corresponding to FIG. 3A. FIG. 4B is a sectional view taken along the line B-B of FIG. 4A.

In this embodiment, where the protective insulating film 24 is formed thick as described above, the spread of each fuse blow mark 27 in the horizontal direction is narrower than that of each fuse blow mark 17 illustrated in FIG. 2A and FIG. 2B. Specifically, the expansion of the blow mark of a fuse element to an area above its adjacent fuse element due to the propagation of the force of an explosion in the horizontal direction by laser irradiation can be prevented more securely than in the first embodiment.

The desired effect becomes greater as the protective insulating film 24 becomes thicker. The best thickness of the protective insulating film 24 is therefore one that brings the protective insulating film 24 and its adjacent protective insulating film 24 into contact with each other.

The protective insulating film 24 is formed by, for example, plasma CVD after the fuse elements 13 are formed on the insulating film 12. A silicon nitride film or other insulating films for forming the protective insulating film 24 is formed on all surfaces of each fuse element 13, including the top surface and the side surfaces, and the insulating film is etched back until the top surface of the fuse element 13 is exposed, while leaving the insulating film on the side surfaces of the fuse element 13.

The protective insulating film 24 accordingly requires an etch back step in addition to the steps for forming the protective insulating film 14 in the semiconductor device 100. However, the thick protective insulating film 24 enhances the effect of preventing damage to adjacent fuse elements that is provided by the semiconductor device 100 of the first embodiment.

In addition, although explosion occurs when the vapor pressure of the laser light irradiated portions is slightly lower than in the semiconductor device 100 because no protective insulating film is formed on the top surfaces of the fuse elements 13, the vapor pressure of the laser light irradiated portions in the semiconductor device 200 at the time of explosion can be still higher than in the semiconductor device 400 of the related art due to the protective insulating film 24 formed on the side surfaces of the fuse elements 13. The readhesion of the melted and evaporated conductive body to the inside of the fuse blow marks 27 can thus be avoided as well.

Third Embodiment

Figure 5A:
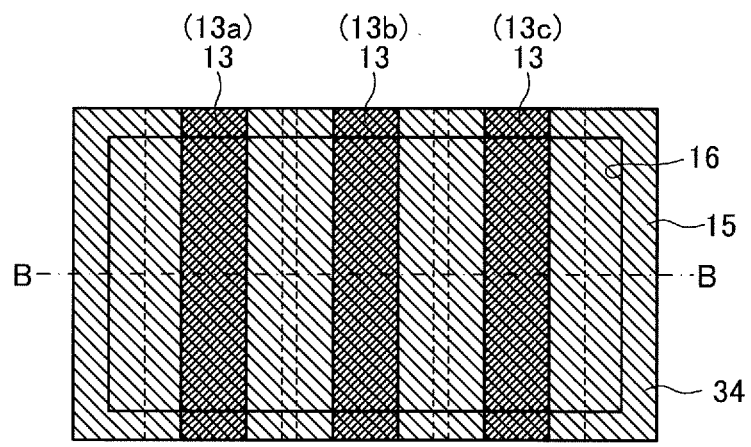
FIG. 5A and FIG. 5B are diagrams for illustrating the structure of a semiconductor device 300 according to a third embodiment of the present invention.
Figure 5B:
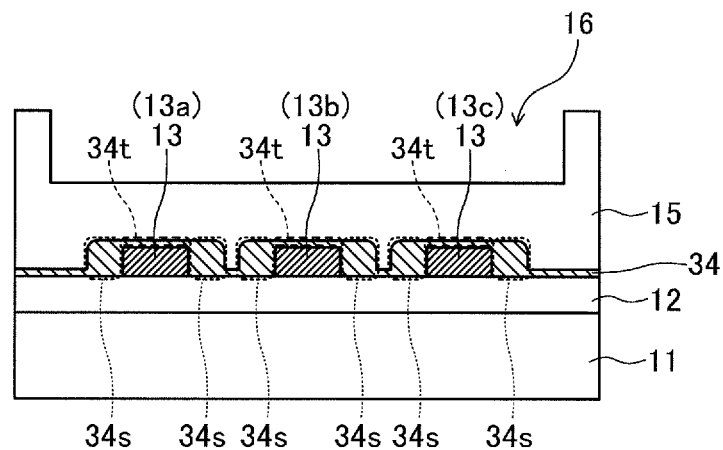

FIG. 5A and FIG. 5B are diagrams for illustrating the structure of a semiconductor device 300 according to a third embodiment of the present invention. FIG. 5A is a plan view of an area of the semiconductor device 300 that has a plurality of fuse elements formed therein. FIG. 5B is a sectional view taken along the line B-B of FIG. 5A.

In the semiconductor device 300 of this embodiment, a protective insulating film 34 is formed in place of the protective insulating film 14 in the semiconductor device 100 of the first embodiment which is illustrated in FIG. 1A and FIG. 1B. Similar to the protective insulating film 14, the protective insulating film 34 can be formed of an insulating film that is higher in mechanical strength than the insulating film 15, for example, a silicon nitride film or a silicon oxynitride film.

The rest of the configuration of the semiconductor device 300 is the same as the semiconductor device 100 of FIG. 1A and FIG. 1B. Components of the semiconductor device 300 that are the same as those of the semiconductor device 100 are therefore denoted by the same reference symbols, and duplicate descriptions are omitted as appropriate.

As illustrated in FIG. 5A and FIG. 5B, the protective insulating film 34 is formed to cover the side surfaces and top surfaces of the plurality of fuse elements 13, and the top surface of the insulating film 12.

The protective insulating film 34 includes first portions 34s, which are formed on the side surfaces of the fuse elements 13, and second portions 34t, which are formed on the top surfaces of the fuse elements 13.

The first portions 34s of the protective insulating film 34 are formed to a thickness greater than that of the second portions 34t.

As described in the second embodiment, a better effect is obtained when the first portions 34s of the protective insulating film 34 are thicker, and the best thickness of the first portion 34s is one that brings the adjacent first portions 34s into contact with each other.

As described in the first embodiment, it is difficult to blow the fuse elements 13 under ordinal laser irradiation conditions when the second portions 34t of the protective insulating film 34 are too thick. A preferred thickness of the second portions 34t is therefore 100 nm or less.

The protective insulating film 34 is formed by first removing a silicon nitride film or other insulating films for forming the protective insulating film 34 so that the top surfaces of the fuse elements 13 are exposed whereas the insulating film is left on the side surfaces of the fuse elements 13, as when the protective insulating film 24 is formed in the second embodiment. Thereafter, an insulating film is formed by plasma CVD on the entire surface to a thickness necessary for the second portions 34t of the protective insulating film 34.

Figure 6A:
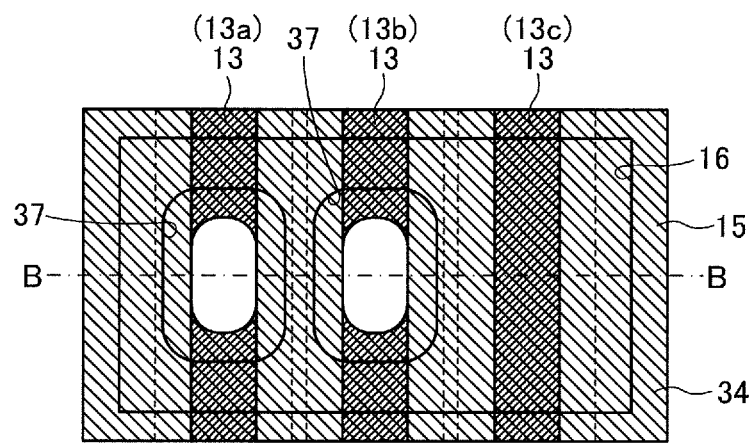
FIG. 6A and FIG. 6B are diagrams for illustrating a state after some of the fuse elements are blown in the semiconductor device 300 of FIG. 5A and FIG. 5B.
Figure 6B:
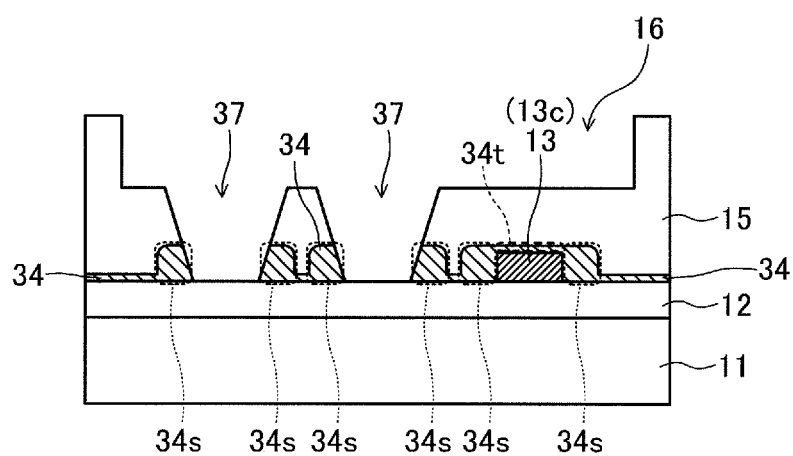
Figure 7A:
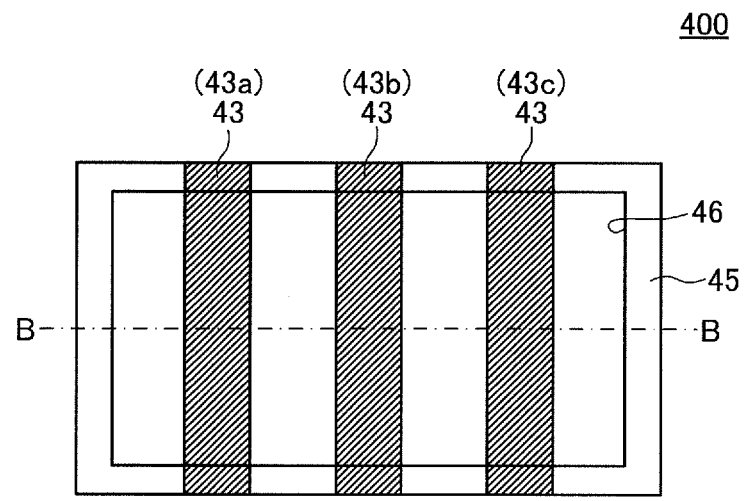
FIG. 7A and FIG. 7B are diagrams for illustrating the structure of a semiconductor device 400 of the related art.
Figure 7B:
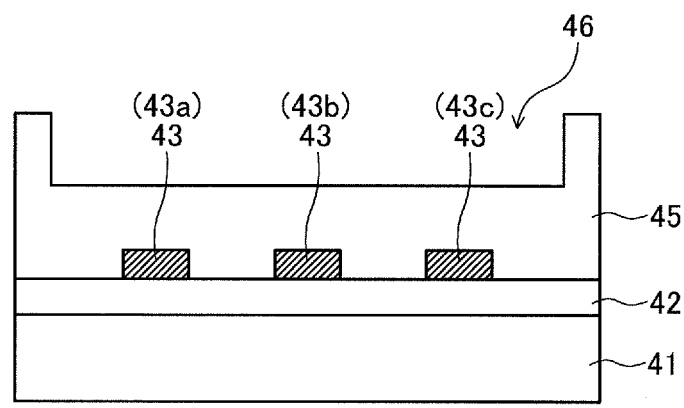

A state where the fuse elements 13a and 13b in the semiconductor device 300, which is formed as described above, are cut by laser irradiation is illustrated in FIG. 6A and FIG. 6B. FIG. 6A is a plan view corresponding to FIG. 5A. FIG. 6B is a sectional view taken along the line B-B of FIG. 6A.

As illustrated in FIGS. 6A and 6B, no readhesion layer is formed inside fuse blow marks 37, which are formed around the respective cut portions of the fuse elements 13a and 13b. A short circuit between the cut fuse elements 13a and 13b is therefore prevented. This is because, as in the semiconductor device 100 of the first embodiment, when the side surfaces and top surfaces of the fuse elements 13 are covered with the protective insulating film 34, it is ensured that explosion occurs after the portions of the conductive body that are irradiated with laser light reach a high enough vapor pressure level, which helps to scatter the melted and evaporated conductive body far.

In addition, the spread of each fuse blow mark 37 in the horizontal direction is narrower than that of each fuse blow mark 17 illustrated in FIG. 2A and FIG. 2B. Specifically, the expansion of the blow mark of a fuse element to an area above its adjacent fuse element due to the propagation of the force of an explosion in the horizontal direction by laser irradiation can be prevented more securely than in the first embodiment.

According to this embodiment, the spreading of the fuse blow marks 37 in the horizontal direction can thus be prevented by forming the first portions 34s of the protective insulating film 34 thick and thus supporting the side surfaces of the fuse elements 13 more solidly than in the first embodiment. In addition, when the second portions 34t of the protective insulating film 34 is formed on the top surfaces of the fuse elements 13 to a thickness at which the fuse elements 13 can be blown by laser irradiation, it is ensured that explosion occurs after portions of the conductive body that are irradiated with laser light reach a high enough vapor pressure level as in the first embodiment.

According to the present invention, a short circuit between adjacent fuse elements due to the readhesion of the conductive body can thus be avoided, and damage or breakage that is inflicted by a blown fuse element on its adjacent fuse element is prevented. The yield and reliability of the semiconductor device are therefore improved.

The embodiments of the present invention have been described above, but the present invention is not limited to the above-mentioned embodiments, and as a matter of course, various modifications can be made thereto without departing from the gist of the present invention.

For instance, while an example of using a polysilicon film as a conductive body for forming the fuse elements 13 is given in the embodiments described above, the present invention is not limited thereto. Examples of a film that can be used for the fuse elements 13 include a high melting point metal film, and a laminate film in which one of a titanium silicide film, a tungsten silicide film, and a cobalt silicide film is layered on a polysilicon film.

What is claimed is:

1. A semiconductor device, comprising:
   a first insulating film formed on a semiconductor substrate;
   an unblown fuse element and a fuse blow mark which is left by fuse blowing, each formed adjacent to one another on the first insulating film;
   a protective insulating film for covering at least side surfaces of the unblown fuse element; and
   a second insulating film formed of one of a BPSG film and a PSG film to cover the unblown fuse element and the protective insulating film, the protective film and the second insulating film not covering the fuse blow mark;

the protective insulating film being higher in mechanical strength than the second insulating film.

2. A semiconductor device according to claim 1, wherein the protective insulating film comprises first portions for covering the side surfaces of the plurality of fuse elements, and second portions for covering top surfaces of the plurality of fuse elements.

3. A semiconductor device according to claim 2, wherein the first portions of the protective insulating film are thicker than the second portions.

4. A semiconductor device according to claim 2, wherein the second portions of the protective insulating film have a thickness of 100 nm or less.

5. A semiconductor device according to claim 1, wherein the protective insulating film comprises one of a silicon nitride film and a silicon oxynitride film.

6. A semiconductor device according to claim 1, wherein the plurality of fuse elements comprise one of a polysilicon film, a high melting point metal film, and a laminate film in which one of a titanium silicide film, a tungsten silicide film, and a cobalt silicide film is layered on a polysilicon film.

* * * * *